United States Patent

[11] 3,575,661

[72] Inventor William H. Slavik
Oak Lawn, Ill.

[21] Appl. No. 773,520
[22] Filed Nov. 5, 1968
[45] Patented Apr. 20, 1971
[73] Assignee Motorola, Inc.
Franklin Park, Ill.

[54] REMOTE CONTROL TUNING CIRCUIT
8 Claims, 2 Drawing Figs.

[52] U.S. Cl. .......... 325/390, 325/468, 334/15
[51] Int. Cl. .......... H04b 1/16
[50] Field of Search .......... 325/390, 391, 420, 421, 422, 464, 469, 470, 452—456; 334/11, 13, 16, 15, 14; 307/235, 246

[56] References Cited

UNITED STATES PATENTS

| | | | |
|---|---|---|---|
| 2,266,065 | 12/1941 | Muller | 334/11 |
| 2,404,101 | 7/1946 | Shock | 325/391 |
| 2,730,616 | 1/1956 | Bastow | 325/422 |
| 3,467,870 | 9/1969 | Aoyama | 325/470 |

*Primary Examiner*—Robert L. Griffin
*Assistant Examiner*—Benedict V. Safourek
*Attorney*—Mueller and Aichele

ABSTRACT: Remote control tuning of a television set is accomplished by providing a desired DC voltage level derived from an input signal at a particular frequency to a capacitor through a neon tube, and the voltage level stored in the capacitor is coupled to a varactor tuner by a field-effect transistor. In order to insure accurate tuning, the output of an automatic frequency control (AFC) circuit is added to the voltage present on the capacitor to modify the voltage level supplied to the field-effect transistor, thereby modifying the tuning voltage of the tuner causing it to pull on to the correct frequency.

Inventor
WILLIAM H. SLAVIK
BY
Mueller, Aichele & Rauner
ATTYS.

REMOTE CONTROL TUNING CIRCUIT

BACKGROUND OF THE INVENTION

In controlling the tuning of a television set, it is desirable to be able to control the tuning from a remote location. Use of a varactor tuner enables a variable DC voltage to be utilized for tuning across the VHF or UHF bands of the set. Since it is difficult to develop a precise DC voltage level over long distances, alternating current control signals transmitted either on a RF carrier, wire lines, or as sound signals are generally used to control the magnitude of the DC tuning control voltage. Where more than one control function is desired, the control signals may be given different frequencies for each function so that the receiving system can distinguish between them. Thus, in the case of a tuner for a television receiving set, one frequency may be utilized to provide positive voltage increments to the tuner to tune the set in one direction, while a second frequency may be utilized to supply negative increments of DC voltage to tune the set in the other direction.

In one possible tuning control system, DC control voltages in response to AC control signals may be supplied from a remote station or location. A capacitor is used to store the input signals and is coupled to the utilization circuits through a high impedance output circuit. The input to the capacitor for supplying the DC voltages thereto is a neon tube, which presents a very high impedance to the capacitor when the tube is nonconducting. As a consequence, the capacitor retains a charge placed thereon for a long period of time with no appreciable drop or noticeable change in the charge. When the output of such a control circuit is used for tuning a television receiver, however, there is a possibility that the voltage stored on the capacitor under control of the remote location may not be the voltage required to bring the set exactly into tune. As a consequence, it is possible that the set, after remote tuning is completed, would be operating out of tune, either slightly over or slightly under the proper frequency for the selected channel. As a consequence, it is desirable to provide some means for bringing the tuner onto the correct frequency, even though the input signals from the remote control source may be terminated at a point where the receiver is slightly out of tune.

SUMMARY OF THE INVENTION

An object of this invention is to accurately tune a receiver to a particular frequency from a remote location.

Another object of this invention is to tune a receiver to a particular frequency by continuous tuning, with automatic retention of the proper tuning frequency.

A further object of this invention is to provide remote control tuning of a receiver with an inexpensive storage element and with the potential stored thereon being automatically varied in accordance with deviations from the desired frequency.

In accordance with a preferred embodiment of the invention, a capacitance storage device is supplied with a DC potential corresponding to the desired frequency to which a receiver is to be tuned. The storage device then remains at the potential corresponding to this desired frequency, and the output thereof is supplied through a high impedance circuit to a voltage responsive tuning circuit. In addition a voltage derived from an automatic frequency control (AFC) discriminator connected to the IF stages of the receiver is added to the voltage stored on the capacitor storage device to modify the voltage stored on the capacitor. This then causes a modification of the voltage supplied to the high impedance circuit, the output of which then varies the tuning voltage to cause the tuner to pull onto the correct frequency and to remain at that frequency.

DETAILED DESCRIPTION

Figure 1:
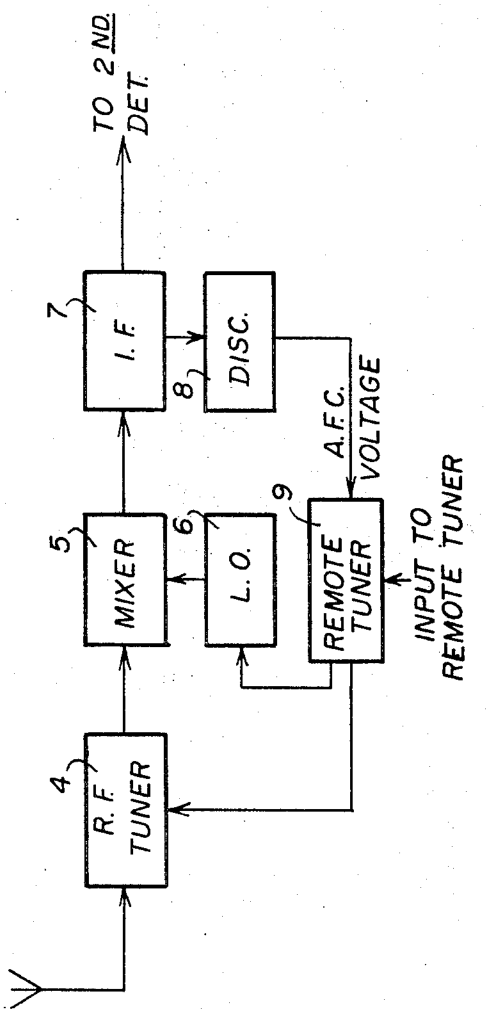
FIG. 1 is a block diagram of a portion of a television receiving station incorporating a circuit for remote control of the tuner.

Referring now to FIG. 1, there is shown the input portion of a television receiver having a remote-controlled tuner operated in accordance with a preferred embodiment of this invention. Signals received by the television receiver are supplied from an antenna to an RF tuner stage 4, the output of which is supplied to a mixer 5, which also has input signals supplied to it from a local oscillator 6. The mixer 5 supplies an intermediate frequency (IF) output in a well-known manner to an IF amplifier 7 which is coupled to the second detector (not shown) of the receiver. The second detector and the stages following it are not necessary for an understanding of this invention, so they have not been shown in FIG. 1.

The output of the IF amplifier 7 also is supplied to an automatic frequency control (AFC) discriminator circuit 8, which provides an output voltage, the polarity and magnitude of which indicate the amount and direction of deviation of the signal from the desired IF frequency corresponding to a properly tuned receiver. If the receiver is properly tuned, no voltage is obtained from the output of the discriminator circuit 18. If the tuner is not properly tuned, however, the output of the AFC discriminator 8 is either a positive or negative voltage of a magnitude corresponding to the amount and direction which the receiver is out of tune.

Tuning of the RF tuner 4 and the local oscillator 6 is accomplished by a remote-controlled tuner 9 which responds to remote tuning signals. In addition, the remote tuner 9 is further controlled by the output voltage from the discriminator circuit 8 in order to cause the variable output voltage derived from the tuner 9 to be such as to cause the RF tuner 4 and the local oscillator 6 to be properly tuned to the selected frequency.

Figure 2:
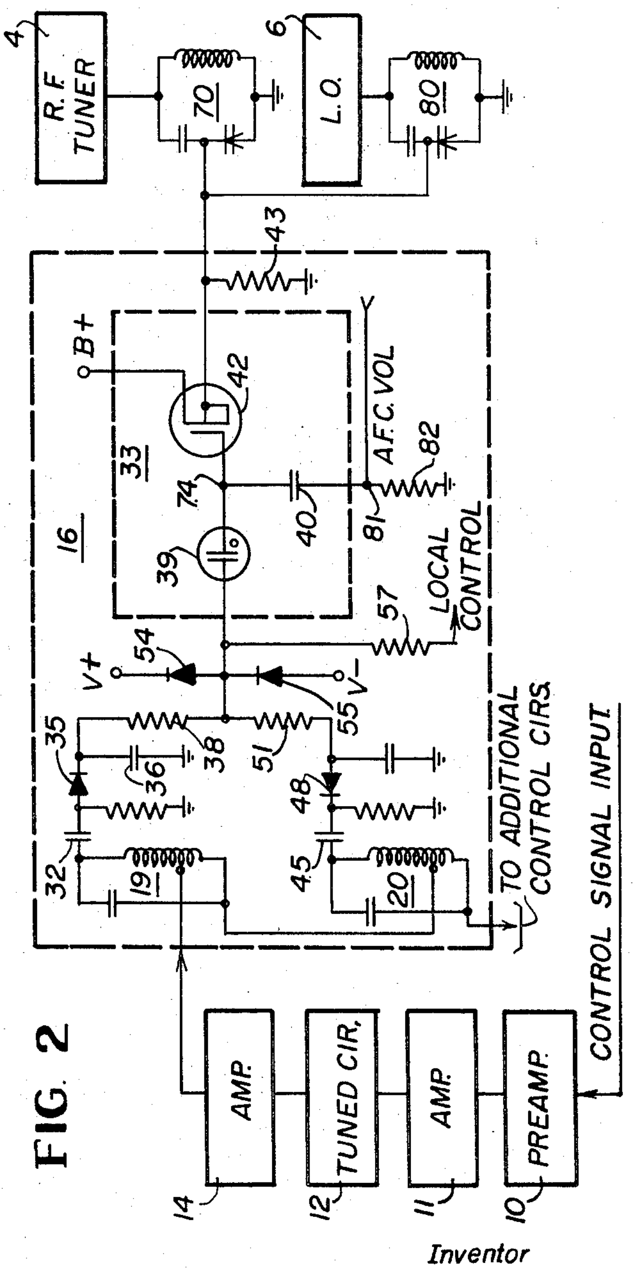
FIG. 2 is a partial schematic and partial block diagram of a tuner control circuit incorporating the features of a preferred embodiment of this invention.

Referring now to FIG. 2, there is shown a system which may be used to develop the DC control voltages required for tuning the receiver shown in FIG. 1. In order to tune the receiver shown in FIG. 1, a control signal is transmitted to the receiver from a remote station; and this control signal may be a tone carried by an RF carrier, a wireline, or a sound signal. The control signal is received at the receiver by any suitable means (not shown) and is changed to an electrical signal of the proper frequency to carry out the tuning function desired. In order to provide continuous tuning in either direction, only two control signals are necessary so that the circuit need respond to only two different control frequencies.

The control signals are applied to a preamplifier 10, the output of which is amplified in a first amplifier 11 and coupled to a final amplifier 14 through a tuned circuit 12. The tuned circuit 12 is a band-pass filter which passes only the control frequencies which are necessary to operate the tuner. The output of the amplifier 14 is coupled to a control circuit 16, which provides the DC voltages for controlling the tuning of the television receiver. Included in the control circuit 16 are two tuned circuits, 19 and 20, each of which responds to a control signal of a different particular frequency.

Assume that a control signal is received having the frequency to which the tuned circuit 19 is tuned. The output signal from the tuned circuit 19 is coupled through a capacitor 32 to a diode 35 which rectifies the signal to develop a positive pulsating DC signal which is filtered by a capacitor 36 and applied through a resistor 38 to a storage module 33. The resistor 38 and a resistor 51 determine the charging time constant of the circuit and isolate the two tuned circuits 19 and 20 from one another.

The signal voltage from the resistor 38 is applied to the input of a neon tube 39; and if it is in excess of the breakdown voltage of the tube, the tube conducts and applies the positive pulsating signal to a capacitor 40, charging the capacitor. When the input signal ceases, the neon tube 39 stops conduction and the capacitor 40 holds its charge at the level to which it was charged. Since the capacitor 40 is chosen to have a very high leakage resistance and the neon tube 39 has an extremely high resistance when it is not conducting, the charge on the capacitor 40 remains at its established voltage level.

The voltage level on the capacitor 40 is coupled through an insulated-gate field-effect transistor (IGFET) 42, exhibiting a very high input resistance to a pair of utilization circuits in the form of varactor tuning circuits 70 and 80 which control the frequency response of the RF tuner 4 and the output frequency of the local oscillator 6, respectively. The DC voltage obtained from the output of the transistor 42 across a resistor 43 and applied to the varactor tuning circuits 70 and 80 determines the capacitance of the varactors in the tuning circuits, and thus controls the resonant frequencies of the tuned circuits 70 and 80.

When the control signal input is of the frequency to which the tuned circuit 20 is tuned, it is coupled to the neon tube 39 through a coupling capacitor 45, a resistor 51 and a diode 48. The diode 48 is poled in the opposite direction from the diode 35 and rectifies the signal, so that a negative pulsating signal is applied across the neon tube 39, causing the tube to conduct. This negative pulsating signal discharges the voltage appearing across the capacitor 40 to change the conduction of the field-effect transistor 42 and thus the voltage appearing across the output resistor 43. When the input control signal stops, the conduction of the neon tube 39 terminates; and the new voltage level established across the capacitor 40 remains.

Although the system described thus far provides a relatively adequate tuning of the television receiver, it still is possible that at the time the control signal input is terminated, the receiver is not quite properly tuned to the correct frequency, that is, the RF tuner 4 and local oscillator 6 may be a few cycles above or a few cycles below the proper frequency for the selected channel. In order to insure that the receiver is properly tuned irrespective of the fact that the tuning signal from the remote source may otherwise cause the receiver to be slightly out of tune, the AFC voltage derived from the discriminator 8 is applied to the control circuit 33 at a junction 81 of the capacitor 40 and a resistor 82 connected between the capacitor 40 and ground.

Because the capacitor 40 is otherwise isolated due to the fact that the neon tube 39 is nonconductive, presenting an open circuit, and the input impedance of the field-effect transistor 42 is extremely high, this voltage obtained from the output of the AFC discriminator circuit 8 causes the potential at the junction 74 connected to the gate of the field-effect transistor 42 to be modified directly in accordance with the voltage obtained from the discriminator 8. Thus, the voltage from the discriminator 8 is added to the voltage already present on the capacitor 40 from the control signal input circuit, causing the output voltage obtained from the field-effect transistor 42 to be varied, which in turn changes the capacitances of the tuned circuits 70 and 80, causing the tuner to pull onto the correct frequency. Whenever proper tuning is achieved, no voltage is obtained from the output of the discriminator 8; so that the circuit remains at the proper frequency. Any tendency for the circuit to drift from the proper frequency is compensated for by the output voltage of the AFC discriminator circuit 8, which is supplied to the control circuit 33 at the junction 81.

A local control signal may be applied through a resistor 57 to the neon tube 39 directly to change the charge on the capacitor 40. Since the local control signal can be connected to the neon tube 39, the tuned circuits 19 and 20 are not necessary for the local control signal.

In the system shown, the output signals from the tuned circuits 19 and 20 could be strong enough to develop a charge across the capacitor 40 which would bias the field-effect transistor 42 into a region where operation of the system would become difficult or impossible. To prevent this, a pair of clamping diodes 54 and 55 are used to limit the positive and negative excursions of the signal applied to the neon tube 39. Thus, the magnitude of the voltages appearing across the capacitor 40 is limited. The negative voltage applied to the diode 55 may be made equal to the ionization potential of the tube 39, so that a negative voltage cannot be developed across the capacitor 40 and the field-effect transistor 42 cannot receive a negative bias.

It should be noted that control signal inputs of other frequencies than those just required to control the tuning of the circuit shown in FIG. 1 may be used in the receiver of which this tuning circuit is a part. For example, additional frequencies could be utilized to control the hue or to control the chroma circuits of a color television receiver. In such an application, the bandwidth of the tuned circuit 12 should be sufficient to accommodate these additional frequencies; and additional control circuits similar to the control circuit 16 could be connected to the output labeled "additional control circuits" shown in FIG. 2 with memory circuits of the type shown in circuit 33 then being utilized to supply control signals for performing these additional functions.

I claim:

1. A tuner control circuit for developing a desired DC voltage level in response to input signals applied thereto in a receiver having an RF tuner and an IF amplifier with a frequency discriminator circuit connected to the output of the amplifier, said tuner control circuit including:
   a memory capacitor;
   a high impedance output circuit and a normally nonconductive voltage sensitive bidirectionally conductive input circuit connected to the capacitor and rendered conductive by a voltage thereacross in either direction greater than a predetermined magnitude;
   means for supplying input signals to the voltage sensitive input circuit, input signals producing a voltage across the input circuit in excess of said predetermined magnitude causing the input circuit to conduct to change the charge on the capacitor, the capacitor retaining the charge whenever the input circuit again becomes nonconductive; and
   means for coupling the output of the frequency discriminator to the capacitor to add said discriminator output to the charge on the capacitor to thereby modify the potential supplied by the capacitor to the high impedance output circuit.

2. A control circuit according to claim 1 further including a voltage-responsive tuning device in said RF tuner and coupled to the output of the high impedance output circuit.

3. A control circuit according to claim 1 wherein the high impedance output circuit and the input circuit are connected to one terminal of the capacitor and wherein the output of the frequency discriminator is coupled to the other terminal of the capacitor.

4. A control circuit according to claim 3 further including impedance means and wherein said other terminal of the capacitor is connected through the impedance means to a point of reference potential and the output of the frequency discriminator is coupled to the junction between said other terminal of the capacitor and the impedance means.

5. A tuner control circuit for a receiver having an RF tuner stage, an IF amplifier stage and an AFC discriminator connected to the IF amplifier stage, the tuner control circuit producing a DC output voltage indicative of the tuning frequency including in combination:
   a high impedance output circuit;
   capacitance means coupled to the high impedance output circuit;
   a source of DC tuning signals;
   a normally nonconductive voltage sensitive switching device coupled between the source of tuning signals and the capacitance means, said switching device being responsive to a potential thereacross in either direction greater than a predetermined magnitude to become conductive;

means for applying the tuning signals to the switching device, tuning signals resulting in a potential across the switching device greater than said predetermined magnitude causing the switching device to become conductive to change the charge on the capacitance; and means for coupling the output of the AFC discriminator to the capacitance means to thereby modify the voltage supplied by the capacitance means to the high impedance output circuit.

6. A control circuit according to claim 5 wherein the RF tuner is a voltage-responsive tuner coupled to the high impedance output circuit.

7. A control circuit according to claim 5 wherein the voltage sensitive switching device is a neon tube and the high impedance output circuit is a field-effect transistor, with the capacitance means being connected at one terminal thereof to the junction between the output of the neon tube and the input to the field-effect transistor.

8. A control circuit according to claim 7 further including an impedance means and wherein the other terminal of the capacitance means is connected through the impedance means to a reference potential and wherein the output of the AFC discriminator is coupled to the junction between this other terminal of the capacitance means and the impedance means.